(12) United States Patent
Park

(10) Patent No.: US 8,520,383 B2
(45) Date of Patent: Aug. 27, 2013

(54) HEAT DISSIPATING DEVICE

(75) Inventor: Kwan Woo Park, Seoul (KR)

(73) Assignee: LG Electronics Inc., Seoul (KR)

( * ) Notice: Subject to any disclaimer, the term of this patent is extended or adjusted under 35 U.S.C. 154(b) by 279 days.

(21) Appl. No.: 12/881,494

(22) Filed: Sep. 14, 2010

(65) Prior Publication Data

US 2011/0063800 A1 Mar. 17, 2011

(30) Foreign Application Priority Data

Sep. 14, 2009 (KR) .................. 10-2009-0086593

(51) Int. Cl.
*H05K 7/20* (2006.01)
*F21V 29/02* (2006.01)

(52) U.S. Cl.
USPC ....... 361/695; 361/697; 361/679.48; 165/121

(58) Field of Classification Search
USPC ................ 361/695, 697, 679.48; 165/121
See application file for complete search history.

(56) References Cited

U.S. PATENT DOCUMENTS

| | | | | |
|---|---|---|---|---|
| 4,595,338 A | * | 6/1986 | Kolm et al. ................... 416/81 |
| 4,751,713 A | * | 6/1988 | Affleck ........................ 372/59 |
| 4,923,000 A | * | 5/1990 | Nelson ....................... 165/122 |
| 5,008,582 A | * | 4/1991 | Tanuma et al. ............... 310/332 |
| 5,335,143 A | * | 8/1994 | Maling et al. ............... 361/694 |
| 6,713,942 B2 | * | 3/2004 | Raman et al. ............ 310/316.01 |
| 7,031,155 B2 | * | 4/2006 | Sauciuc et al. ............... 361/695 |
| 7,321,184 B2 | * | 1/2008 | Lee et al. ..................... 310/341 |
| 7,550,901 B2 | * | 6/2009 | Chrysler et al. ............. 310/330 |
| 7,714,433 B2 | * | 5/2010 | Campini et al. ............. 257/722 |
| 7,771,167 B2 | * | 8/2010 | Fu ............................... 416/100 |
| 2004/0190305 A1 | * | 9/2004 | Arik et al. ................... 362/555 |
| 2004/0207292 A1 | * | 10/2004 | Scher et al. ................. 310/328 |
| 2004/0253130 A1 | * | 12/2004 | Sauciuc et al. .............. 417/436 |
| 2005/0266295 A1 | * | 12/2005 | Takai .............................. 429/38 |
| 2008/0217764 A1 | * | 9/2008 | Campini et al. ............. 257/721 |
| 2008/0304966 A1 | * | 12/2008 | Fu ............................ 416/132 R |
| 2011/0052394 A1 | * | 3/2011 | Kalhofer ..................... 416/100 |

FOREIGN PATENT DOCUMENTS

| | | | | |
|---|---|---|---|---|
| JP | 01233796 | A | * | 9/1989 |
| JP | 02049999 | A | * | 2/1990 |
| JP | 02181957 | A | * | 7/1990 |

* cited by examiner

*Primary Examiner* — Anatoly Vortman
(74) *Attorney, Agent, or Firm* — KED & Associates, LLP

(57) ABSTRACT

The present invention relates to a heat dissipating device. More particularly, the present invention relates to a heat dissipating device in which an air flow is directed to a heat dissipating member by flapping a blade for making a driving unit and a device therefor small, improving heat dissipating efficiency and reducing noise therefrom.

14 Claims, 26 Drawing Sheets

Neutral position

HEAT DISSIPATING DEVICE

CROSS-REFERENCE TO RELATED APPLICATION(S)

Pursuant to 35 U.S.C. §119(a), this application claims the benefit of earlier filing date and right of priority to Korean Patent Application No. 10-2009-0086593, filed on Sep. 14, 2009, the contents of which are hereby incorporated by reference herein in their entirety.

BACKGROUND

1. Field of the Disclosure

The present invention relates to a heat dissipating device. More particularly, the present invention relates to a heat dissipating device in which an air flow is directed to a heat dissipating member by flapping a blade for making thus permitting the size of a driving unit and a device therefor to be reduced, improving heat dissipating efficiency and reducing noise therefrom.

2. Discussion of the Related Art

Recently, electronic devices, such as lighting apparatus, display devices, handheld terminals, and so on, operate at increasingly faster speeds to increase performance and are quickly becoming lighter, thinner, shorter and smaller than before.

Users of these electronic device demand high performance as well as smaller sizes of the device, and technologies for integrating devices and increasing performance are also applied to these electronic devices.

As these electronic devices increase their performance and speed, the electronic devices generate more heat, increasing the failure rate of the electronic device, and require a heat dissipation design of the electronic device.

Particularly, in a case of an LED, since an environmental temperature change affects a performance and a lifetime of the LED heavily, it is essential that the lighting apparatus of LED has effective heat dissipation.

Along with this, a heat dissipating device is required, which is to be attached to a heat generation region of the electronic device for easy dissipation of the heat from the heat generation region.

In the related art, fans have been used as the heat dissipating device, in general. However, the fans have problems since they have high power consumption and the fan blades generate noise as the fans are made smaller.

SUMMARY OF THE DISCLOSURE

Accordingly, the present invention is directed to a heat dissipating device that substantially obviates one or more problems due to limitations and disadvantages of the related art.

An object of the present invention is to provide a heat dissipating device which can improve heat dissipating efficiency.

Another object of the present invention is to provide a heat dissipating device which can make a size of a driving unit thereof smaller.

Furthermore, another object of the present invention is to provide a heat dissipating device which can reduce noise generated when the heat dissipating device is in operation.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a heat dissipating device includes a heat dissipating member or heat dissipater thermally coupled to a heat generating unit or generator and configured to transmit heat from the heat generating unit to the air, at least one blade for forming an air flow to at least a portion of the heat dissipating member by flapping, and a blade driving unit or drive for driving the blade to flap when operating.

The blade driving unit may drive the blade to flap in up/down directions within a predetermined range of angles during operation.

In this case, the blade driving unit may include at least one shaft, at least one magnet having an upper side and a lower side with polarities different from each other, at least one bobbin connected to the blade and configured to rotate up and down alternately within the predetermined range of angles on an axis of the shaft, and a coil wound on the bobbin spaced from the magnet for enabling to pass a current, wherein the bobbin may drive the blade as the bobbin is rotated by a force generated by the magnet and the coil when the current flows to the coil.

Preferably, the bobbin includes a guide portion having the coil wound thereon, wherein, when the bobbin is at a neutral position, a portion of the coil wound on the guide portion is positioned at a height corresponding to the upper side of the magnet and the other portion of the coil wound on the guide portion is positioned at a height corresponding to the lower side of the magnet.

In this instance, the current flowing to the coil may be an alternating current when the blade driving unit is in operation.

Moreover, preferably, intensity and a cycle of the current flowing to the coil are controllable.

And, the blade may include a first blade connected to one end of the bobbin and a second blade connected to the other end of the bobbin, the magnet may be arranged to pass through a receiving portion in the bobbin, and the shaft may pass through a hole formed to pass through the magnet.

In this case, the magnet may include a first magnet and a second magnet arranged parallel to the first magnet, the coil may include a first coil arranged opposite to the first magnet, and a second coil arranged opposite to the second magnet, and the first blade may be arranged opposite to the first coil and the second blade is arranged opposite to the second coil.

Moreover, a polarity of an upper side of the first magnet may be different from a polarity of an upper side of the second magnet And, the blade may include a first blade and a second blade, the bobbin may include a first bobbin connected to the first blade and a second bobbin connected to the second blade, the magnet may include a first magnet arranged opposite to the first bobbin and a second magnet arranged opposite to the second bobbin, and the shaft may include a first shaft connected to the first bobbin and passing through a first hole formed to pass through the first magnet and a second shaft connected to the second bobbin and passing through a second hole formed to pass through the second magnet.

And, preferably, the blade driving unit further includes a magnetic spring member provided to the bobbin spaced from the magnet, the magnetic spring member being configured such that a restoration force is applied to the magnetic spring in a direction in which magnetic flux from the magnet is the smallest.

In this instance, the magnetic spring may include an iron piece having a center line positioned at a height corresponding to a boundary surface between the upper side and the lower side of the magnet which have polarities different from each other when the bobbin is at the neutral position.

And, the heat dissipating device may further include a housing for rotatably mounting opposite ends of the shaft thereon and fixedly securing the magnet thereto.

And, preferably, the heat dissipating member has one surface in contact with the heat generating unit and the other surface having a plurality of heat dissipating fins provided to an edge thereof spaced from one another.

In this instance, preferably, the blade and the blade driving unit are positioned in a space formed between the other surface of the heat dissipating member and the heat dissipating fins.

In another aspect of the present invention, a heat dissipating device includes a shaft, a bobbin connected to the shaft such that the bobbin rotates in up/down directions alternately on an axis of the shaft within a predetermined range of angle, and a blade connected to the bobbin for forming an air flow to a heat dissipating object by the rotation of the bobbin.

In another aspect of the present invention, a heat dissipating device includes a heat sink having a surface in contact with a heat generating unit and the other surface having heat dissipating fins arranged at an edge thereof to form a space on an inner side of the heat dissipating fins, a blade provided to the space for cooling down the heat dissipating fins as the blade produces an air flow by flapping, and a blade driving unit for driving the blade to flap.

In this instance, the heat generating unit may be an electronic device which generates heat as the electronic device is driven.

And, preferably, the heat generating unit may be one selected from an LED (Light Emitting Diode) lighting apparatus, a CPU (Central Processing Unit), a backlight unit, a display device, a hard disk drive, a portable terminal, a notebook computer, a computer module, and a projector.

And, the heat dissipating fins have bent regions, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the specific embodiments of the present invention, examples of which are illustrated in the accompanying drawings. Wherever possible, the same reference numbers will be used throughout the drawings to refer to the same or like parts.

Figure 1:
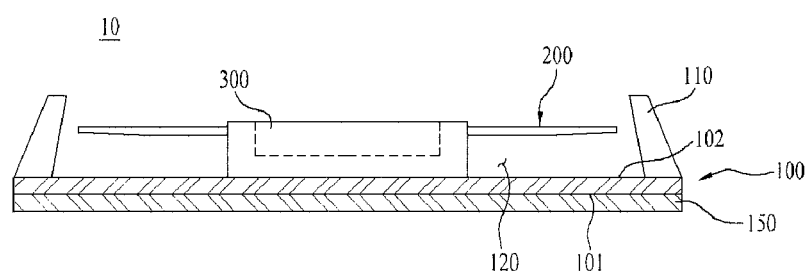
FIG. 1 illustrates a section of a heat dissipating device in accordance with a preferred embodiment of the present invention, schematically.

FIG. 1 illustrates a section of a heat dissipating device in accordance with a preferred embodiment of the present invention, schematically.

Referring to FIG. 1, the heat dissipating device 10 can include a heat dissipating member or heat dissipater 100 thermally coupled to a heat generating unit or heat generator 150 configured to transmit heat from the heat generating unit 150 to the air, at least one blade 200 to be flapped for causing an air flow to at least a portion of the heat dissipating member 100, and a blade driving unit or blade drive 300 for driving the blade 200 to flap in operation.

The heat dissipating member 100 has one surface 101 in contact with the heat generating unit 150, and the other surface 102 is provided with a plurality of heat dissipating fins 110 arranged at an edge thereof spaced from one another.

The heat from the heat generating unit 150 is transmitted to the heat dissipating fins 110 at the other surface 102 of the heat dissipating member 100 through the one surface 101 of the heat dissipating member 100. Thus, the heat dissipating member 100 can be provided with the heat dissipating fins 110 to have an increased contact surface with air for making effective transmission of the heat from the heat generating unit 150 to external air. The heat dissipating member 100 can be called as a heat sink 100 in a view that the heat dissipating member 100 transmits the heat from the heat generating unit 150 to an outside of the device.

The heat generating unit 150 can be an electronic device which generates the heat as it is operated. The heat generating unit 150 will be described in detail, below.

There is a space 120 formed on an inner side of the heat dissipating fins 110. That is, the space 120 is between the heat dissipating fins 110 and the other surface 102 of the heat dissipating member 100, and the blade 200 and the blade driving unit 300 can be positioned in the space 120.

The blade 200 can be defined as a wing for producing an air flow.

Therefore, the heat dissipating device 10 of the embodiment is advantageous in that the blade driving unit 300, on the inner side of the heat dissipating fins 110, flaps the blade 200 to cause the air flow forcibly for dissipating the heat transmitted to the heat dissipating fins 110.

Figure 2:
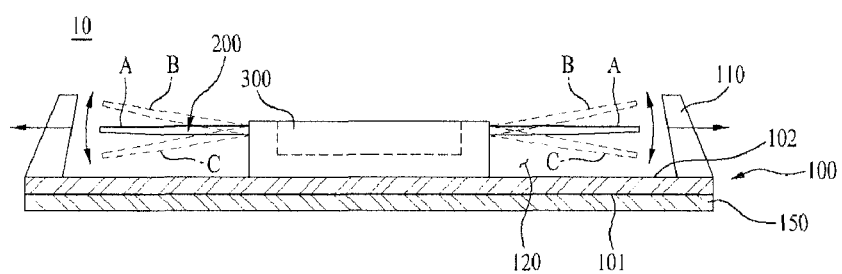
FIG. 2 illustrates a section of a heat dissipating device in accordance with a preferred embodiment of the present invention schematically for describing operation thereof.

FIG. 2 illustrates a section of a heat dissipating device in accordance with a preferred embodiment of the present invention schematically for describing operation thereof.

Since the heat dissipating fins 110 are arranged at the edges of the other surface 102 of the heat dissipating member 100, the blade 200 and the blade driving unit 300 are mounted on the inner side of the heat dissipating fins 110.

At an initial stage, the blade 200 is positioned at 'A' position. When the blade 200 is at a horizontal position thus, the horizontal position of the blade 200 will be called as a neutral position, hereafter. Upon putting the driving unit 300 into operation, the blade 200 moves between an upper position 'B' and a lower position 'C', flapping like a bird.

That is, the blade driving unit 300 is a driving unit for flapping the blade 200 up/down, for causing the air flow in up/down directions of the heat dissipating fins 110.

Thus, the blade driving unit 300 can drive the blade 200 to flap in up/down directions within a predetermined range of angles during operation.

And, referring to FIG. 2, when two blades 200 are provided, the blades 200 can be driven independently, or dependent on movement of the other blade 200, depending on a structure of the blade driving unit 300.

The blade 200 can be formed to have a variety of shapes by adding curves and pass through holes thereto.

Thus, the flapping of the blade 200 causes the air flow on the inner side of the heat dissipating fins 110, and the air flow is brought into contact with the heat dissipating fins 110 forcibly, thereby enabling to cool down the heat transmitted to the heat dissipating fins 110.

Moreover, since the air flow caused by the flapping of the blade 200 has a great flowing pressure toward the heat dissipating fins 110, the air flow can improve efficiency of dissipation of the heat remained in the vicinity of, or in spaces between, the heat dissipating fins 110.

Figure 3:
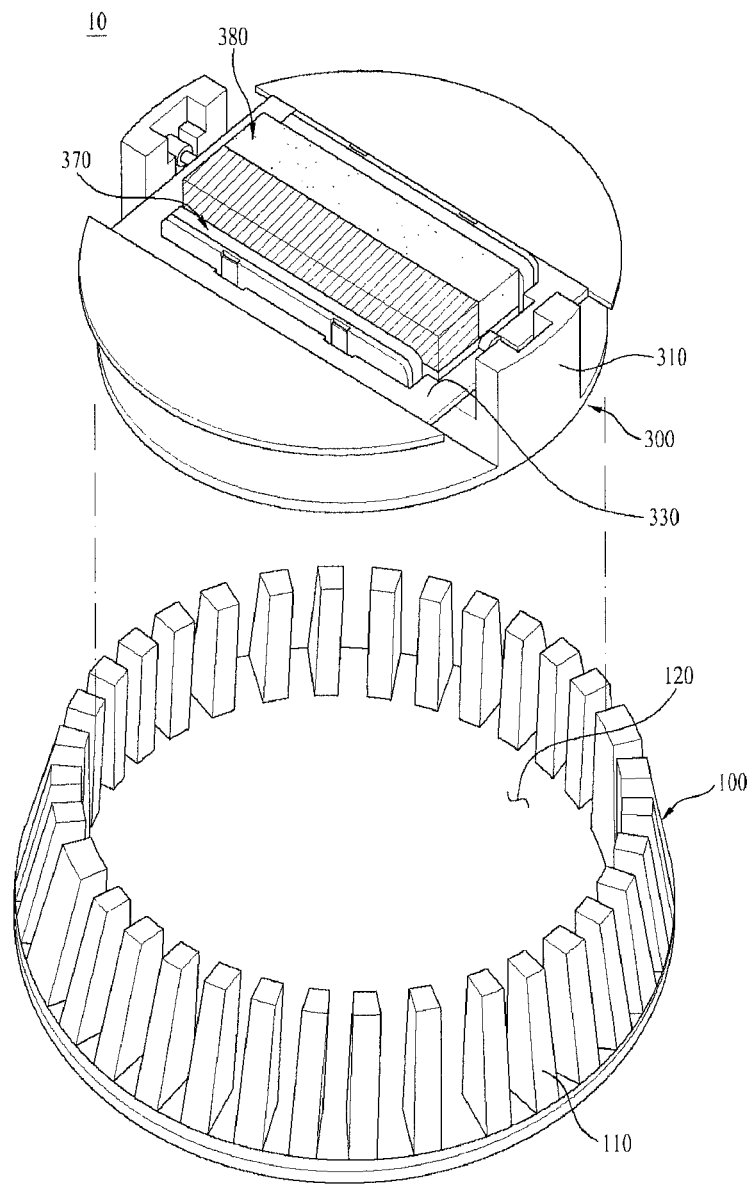
FIG. 3 illustrates an exploded perspective view of a heat dissipating device in accordance with a preferred embodiment of the present invention schematically for describing a mounted state thereof.
Figure 4:
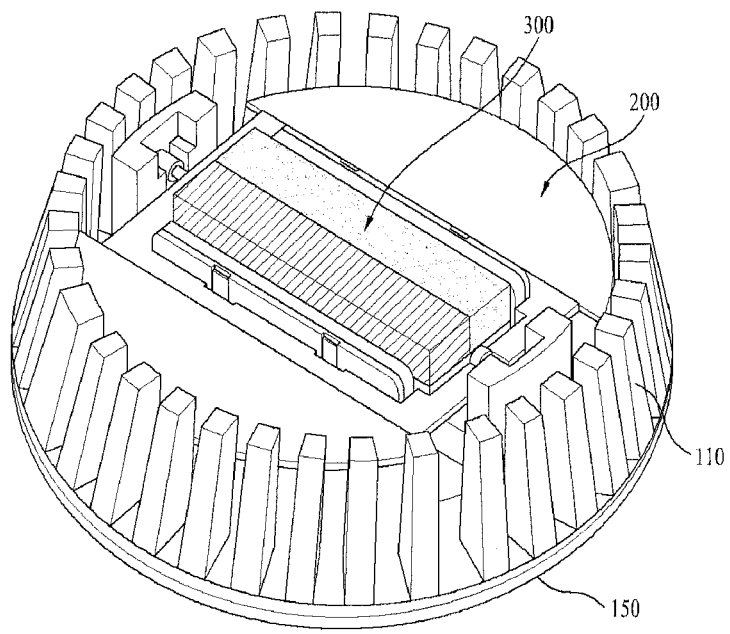
FIG. 4 illustrates a perspective view showing an assembled state of the heat dissipating device in FIG. 3.

FIG. 3 illustrates an exploded perspective view of a heat dissipating device in accordance with a preferred embodiment of the present invention schematically for describing a mounted state thereof, and FIG. 4 illustrates a perspective view showing an assembled state of the heat dissipating device in FIG. 3.

Referring to FIGS. 3 and 4, the blade 200 and the blade driving unit 300 can be mounted to the inner side of the heat dissipating fins 110 of the heat dissipating member 100.

The blade driving unit 300 can include at least one magnet 380, a bobbin 330 having one end connected to the blade 200, and a housing 310 for supporting the magnet 380 and the bobbin 330. In this instance, by mounting the housing to the space 120, the blade driving unit 300 and the blade 200 can be mounted to the heat dissipating member 100.

In order to make the heat dissipating device 10 compact and small, it is preferable that the housing 310 has a height lower than the heat dissipating fins 110.

It is preferable that the blade driving unit 300 flaps the blade 200 by an electromagnetic force, more specifically, a Lorentz force. For this, the blade driving unit 300 can be fabricated to include a structure in which a coil to which a current flow and a magnet which generates a magnetic field arranged opposite to, and spaced from, each other spaced.

A detailed structure of the blade driving unit 300 will be described with reference to FIGS. 5 and 6.

Figure 5:
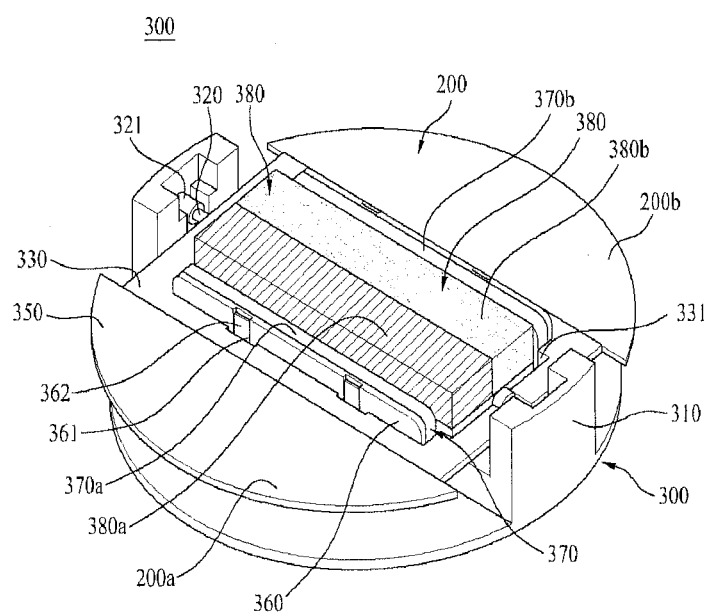
FIG. 5 illustrates a perspective view of a blade driving unit in accordance with a preferred embodiment of the present invention, schematically.
Figure 6:
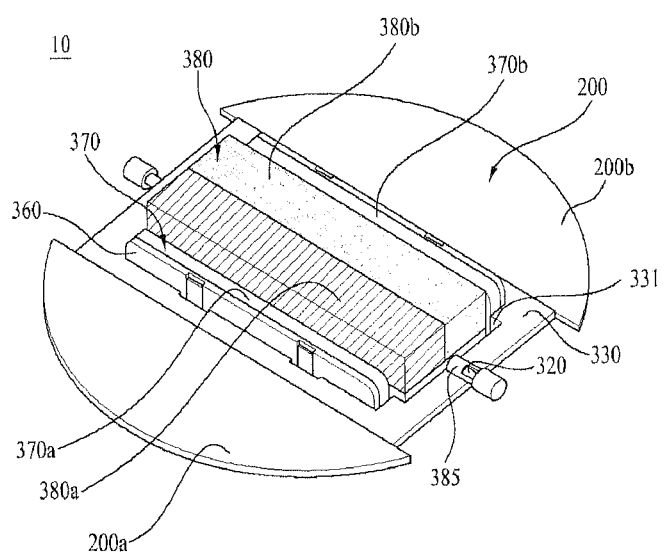
FIG. 6 illustrates a perspective view of the blade driving unit in FIG. 5, partially.

FIG. 5 illustrates a perspective view of a blade driving unit in accordance with a preferred embodiment of the present invention schematically, and FIG. 6 illustrates a perspective view of the blade driving unit in FIG. 5, partially.

Referring to FIGS. 5 and 6, the blade driving unit 300 can include at least one shaft 320, at least one magnet 380 having an upper side and a lower side configured to have polarities different from each other, at least one bobbin 330 connected to the blade 200 configured to rotate in up/down directions alternately within a predetermined range of angle centered on an axis of the shaft 320, and at least one coil 370 wound on the bobbin 330 spaced from the magnet 380 for allowing a current to flow therethrough.

The bobbin 330 rotates by a force generated by the magnet 380 and the coil 370 when the current flow to the coil 370 to drive the blade 220. Such an action of the force and movement of the bobbin 330 and the blade 220 will be described in detail, later.

The bobbin 330 can be provided with a guide portion 360 for winding the coil 370 thereon. The coil 370 can be wound on the guide portion 360 more than once. And, there can be at least one recess 361 in one side of the guide portion 360 for mounting a magnetic spring 362 thereto. The magnetic spring 362 will be described later, in detail.

Moreover, the blade driving unit 300 can include a housing 310 for rotatably mounting opposite ends of the shaft 320 thereon and fixedly securing the magnet 380 thereto, additionally.

The housing 310 can be provided with one pair of bearings (not shown) for receiving the opposite ends of the shaft 320.

The shaft 320 can be rotated smoothly by an external force as the shaft 320 is passed through a hole 385 (See FIG. 15) in the magnet and a hole (not shown) in the bobbin and placed in the bearings of the housing 310.

Though the shaft 320 moves in the hole of the magnet 380 freely, the shaft 320 is fixed to the hole in the bobbin 330 to rotate the bobbin 330 together with the shaft 320.

Therefore, at the time the bobbin 330 is moved by a force generated by the magnet 380 and the coil 370, the magnet 380 does not move, and the blade 200 and the shaft 320 move following movement of the bobbin 330, making the blade 200 flap.

Thus, the shaft 320 is mounted to pass both through the magnet 380 and the bobbin 330, and the magnet 380 is arranged to pass through a receiving portion 331 in the bobbin 330 for enabling the bobbin 330 to move while the magnet 380 is stationary. It is preferable that the receiving portion 331 has a size which does not cause interference with the magnet 380 when the bobbin 330 rotates in the up/down directions.

The housing 310 has a seating portion (not shown) having a height enough to seat the magnet 380 thereon and allow the blade 200 to overhang over a lower side.

In order to facilitate assembly alignment and to provide excellent stability at the time of positioning of the housing 310 in the space 120 on the inner side of the heat dissipating fins 110 of the heat dissipating member 100, the housing 310 can be provided with a flat plate having a shape which resembles the space 120, and the seating portion of the housing 310 can be formed at the flat plate.

The blade 200 includes a first blade 200a connected to one end of the bobbin 330 and a second blade 200b connected to the other end of the bobbin 330. And, the magnet 380 includes a first magnet 380a and a second magnet 380b arranged parallel to the first magnet 380a, and the coil 370 includes a first coil 370a arranged opposite to the first magnet 380a and a second coil 370b arranged opposite to the second magnet 380b. In this instance, the first blade 200a is arranged opposite to the first coil 370a and the second blade 200b is arranged opposite to the second coil 370b.

By providing two blades 200a and 200b, cooling efficiency of the heat dissipating fins can be improved as the air flow becomes smoother.

Moreover, by making currents flow to the first coil 370a and the second coil 370b separately, the blade 200 can be driven by a force generated between the first coil 370a and the first magnet 380a and a force generated between the second coil 370b and the second magnet 380b.

In the embodiment, an upper side polarity of the first magnet 380a can be made different from an upper side polarity of the second magnet 380b.

A principle of the blade 200 driven by the blade driving unit 300 will be described with reference to FIG. 7.

Figure 7:
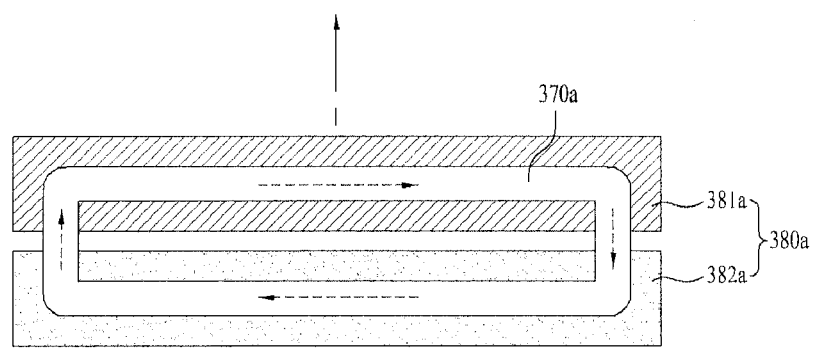
FIG. 7 illustrates a conceptual view for describing a force generated by a magnet and a coil in accordance with a preferred embodiment of the present invention, schematically.

FIG. 7 illustrates a conceptual view for describing a force generated by a magnet and a coil in accordance with a preferred embodiment of the present invention, schematically. In more detail, FIG. 7 illustrates the blade driving unit 300 seen from the first blade 200a, while omitting elements thereof except the first magnet 380a and the first coil 370a for convenience's sake.

The first coil 370a is arranged opposite to, and spaced therefrom, the first magnet 380a (See FIGS. 5 and 6), and the first magnet 380a has upper side polarity and lower side polarity different from each other. It is assumed that the first magnet 380a has an S pole at the upper side 381a and an N pole at the lower side 382a.

Referring to FIG. 7, it is preferable that, at the time the bobbin 330 (See FIGS. 5 and 6) is at the neutral position, a portion of the first coil 370a wound on the guide portion 360 is positioned at a height corresponding to the upper side 381a of the first magnet 380a, and the other portion of the first coil 370a wound on the guide portion 360 is positioned at a height corresponding to the lower side 381a of the first magnet 380a.

That is, in a wound state, the upper side of the first coil 370a is positioned at the height corresponding to the upper side 381a of the first magnet 380a and the lower side of the first coil 370a is positioned at the height corresponding to the lower side 382a of the second magnet 380a.

In this instance, since the lower side 382a of the first magnet is the N pole and the upper side 381a of the first magnet is the S pole, the first coil 370a is in a magnetic field formed in an upper side 381a direction of the first magnet 380a, wholly.

In this state, i.e., in the neutral position, if the current flows in the first coil 370a in a direction of arrows shown in FIG. 7, a Lorentz force which is a force acting on a charged particle moving in a magnetic field acts on the first coil 370a. A direction of the force acting on the first coil 370a is according to the Fleming's left-hand rule.

In detail, the upper side of the first coil 370a at the height of the upper side 381a of the first magnet 380a has a force acting thereto upward in a vertical direction with reference to a surface of the drawing, and the lower side of the first coil 370a at the height of the lower side 382a of the first magnet 380a has a force acting thereto downward in a vertical direction with reference to a surface of the drawing.

At the end, as forces acting in directions different from each other act to the upper side and the lower side of the first coil 370a respectively, the first coil 370a rotates.

In a case the current flows in a direction shown in FIG. 7, the coil 370a shown in FIG. 6 has a force which rotates in a clockwise direction acting thereto, to rotate the bobbin 330 in the clockwise direction on the shaft 320, to drive the first blade 200a. In this instance, since the second blade 200b is also connected to the bobbin 330, the second blade 200b also rotates in the clockwise direction.

Opposite to this, since an electromagnetic force acts in a direction opposite to above if the current flows in a direction opposite to the arrows shown in FIG. 7, to rotate the bobbin 330 in an anti-clockwise direction on the shaft 320.

That is, since the shaft 320 connected to the bobbin 330 is movable by an external force, the shaft 320 rotates in a regular or reverse direction following movement of the bobbin 330.

At the end, as the blade 200 connected to the bobbin 330 moves up and down to flap, the blades 200 produces an air flow.

In this instance, the blade driving unit 300 does not apply a driving force to the shaft 320 directly, but moves the bobbin 330 by means of the electromagnetic force applied to the coil 370 to rotate the blade 200. That is, the shaft 320 serves to provide a shaft for the bobbin 330 to rotate.

Since a force generated by the second magnet 380b and the second coil 370b is similar to the force generated by the first magnet 380a and the first coil 370a, description of the force will be omitted.

Since the embodiment is configured such that the polarities of the upper side of the first magnet 380a and the upper side of the second magnet 380b are different from each other, it is preferable that directions of the currents to the first coil 370a and the second coil 370b are the same. If the directions of the currents to the first and second coils 370a and 370b are not same, since the direction of the rotating force acting to the first coil 370a and the direction of the rotating force acting to the second coil 370b are opposite to each other, a rotating force acting to an entire bobbin 330 can be reduced as the forces offset each other.

In the meantime, referring to FIGS. 5 and 6, the blade driving unit 300 of the embodiment can include a magnetic spring member 362 provided to the bobbin 330 spaced from the magnet 380. The magnetic spring member is configured such that a restoration force is applied to the restoration force in a direction in which magnetic flux from the magnet 300 is the smallest, additionally. This will be described with reference to FIGS. 8 to 10.

Figure 8:
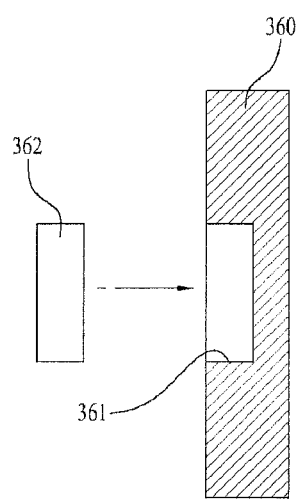
FIG. 8 illustrates a partial section showing a magnetic spring member placed in/fastened to a blade driving unit of the present invention, schematically.
Figure 9A:
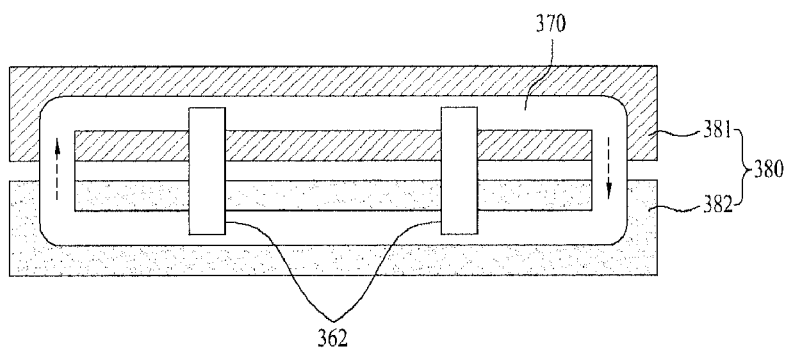
FIGS. 9A and 9B illustrate conceptual views for showing a relation between a magnet and a magnetic spring member in accordance with a preferred embodiment of the present invention.
Figure 9B:
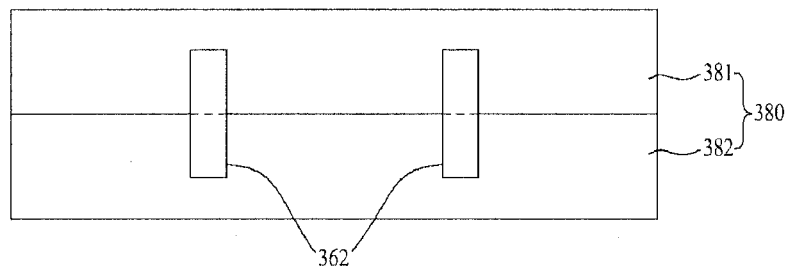
Figure 10:
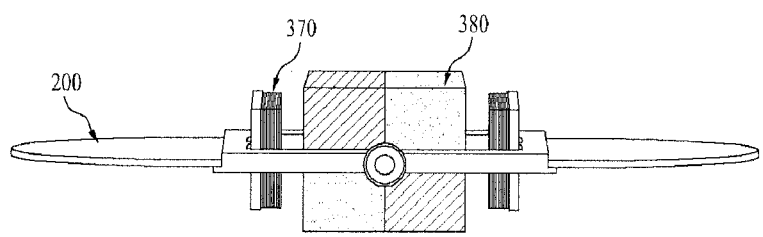
FIG. 10 illustrates a front view showing a state in which a blade is put in a neutral position by a magnetic spring member, schematically.

FIG. 8 illustrates a partial section showing a magnetic spring member placed in/fastened to a blade driving unit of the present invention schematically, and FIGS. 9A and 9B illustrate conceptual views for showing a relation between a magnet and a magnetic spring in accordance with a preferred embodiment of the present invention. FIG. 10 illustrates a front view showing a state in which a blade is placed at a neutral position by a magnetic spring, schematically.

Referring to FIG. 8, the magnetic spring member 362 can be mounted to at least one recess 361 in the bobbin 330, more specifically, in the guide portion 360 of the bobbin.

The recess 361 can be formed in a region of the guide portion 360 opposite to a region on which the coil 370 is wound. That is, the recess 361 is formed on a side opposite to a side on which the coil 370 is provided with reference to the guide portion 360, for placing the magnetic spring member 362 therein.

It is preferable that the magnetic spring member 362 is an iron piece extended in a transverse direction.

Referring to FIG. 9A, an upper side 381 of the magnet 380 is an S pole and a lower side of the magnet 380 is an N pole.

And, referring to FIG. 9B, it is preferable that, at the time the bobbin 330 is at the neutral position, a center line of the magnetic spring member 362 is positioned at a height corresponding to a boundary surface of the upper side 381 and the lower side 382 of the magnet, which have opposite polarities. In FIG. 9B, the center line of the magnetic spring member 362 is marked with a dashed line.

That is, the center line of the magnetic spring member 362 falls on a line which separates the upper side 381 and the lower side 382 of the magnet 380, which have opposite polarities.

In this instance, between the magnetic spring member 362 and the magnet 380, there is a tendency of moving the magnetic spring member 362 to a point at which density of magnetic flux from the magnet 380 is minimized (a stable point at which force is the lowest).

In more detail, at the magnet 380 of the embodiment, while lines of magnetic forces start from a bottom of the lower side 382 which is the N pole and enter to a top of the upper side 381 which is the S pole, density of lines of the magnetic forces is the greatest at the bottom of the lower side 382 of the magnet and the top of the upper side 381 of the magnet, and the smallest in the vicinity of a line at which the lower side 382 and the upper side 381 of the magnet are separated. Therefore, when the magnetic spring member 362 oscillates in up/down directions, a restoration force is applied to the restoration force in a direction of the line of separation of the upper/lower sides of the magnet 380.

The tendency of moving the magnetic spring member 362 to the point where the density of the magnetic flux is the smallest can be defined as a magnetic spring principle.

Therefore, even if no power is applied to the blade driving unit 300, the center line of the magnetic spring member 362 is positioned at the boundary surface of the upper side 381 and the lower side 382 of the magnet 380, enabling the magnetic spring member 362 to maintain the neutral position as shown in FIG. 10.

And, when the coil 370 and the magnetic spring member 362 rotate, a restoration force acts to the blade 200 in a direction opposite to the rotating direction.

Movement of the blade 200 will be described in detail, with reference to FIGS. 11 to 13.

Figure 11A:
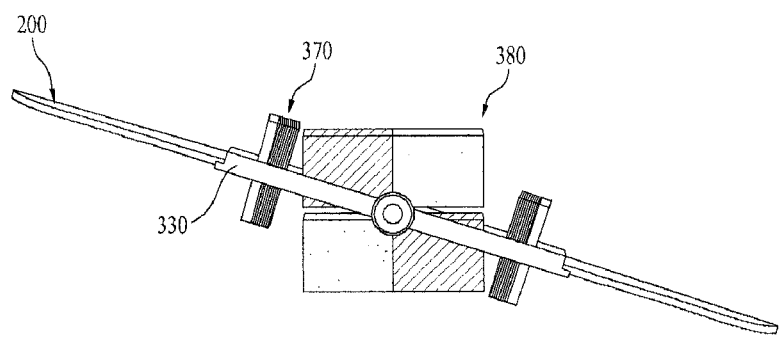
FIGS. 11A to 11C illustrate perspective views for describing a detailed operation of flapping of a blade in accordance with a preferred embodiment of the present invention.
Figure 11B:
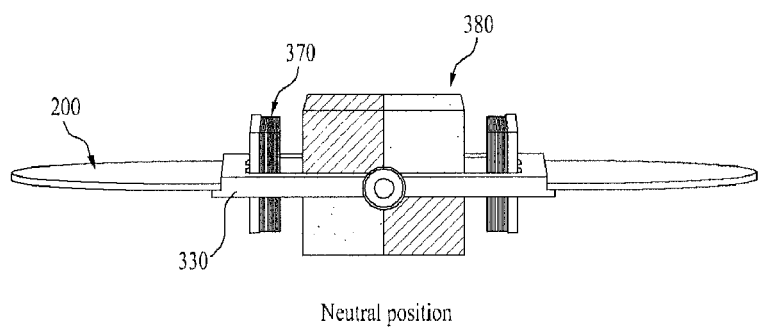
Figure 11C:
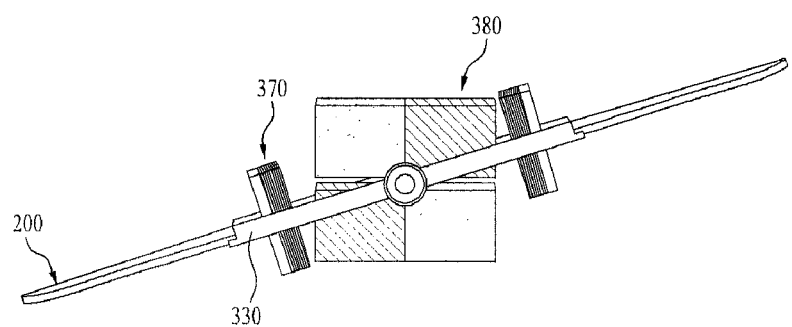
Figure 12:
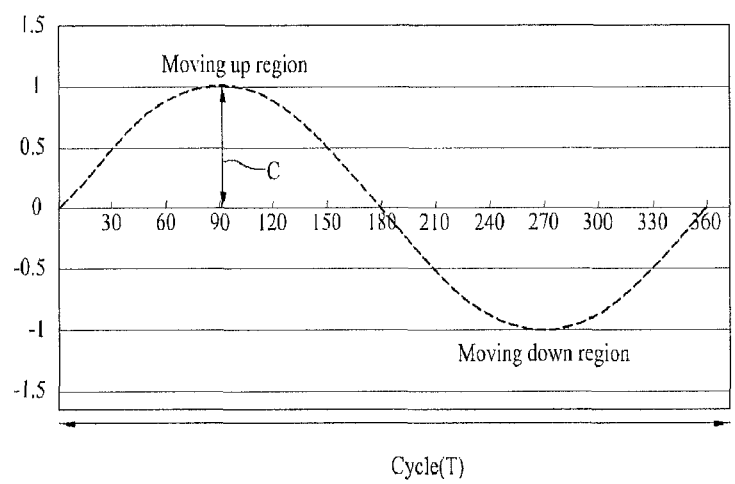
FIG. 12 illustrates a waveform of a current applied to a coil in accordance with a preferred embodiment of the present invention.
Figure 13:
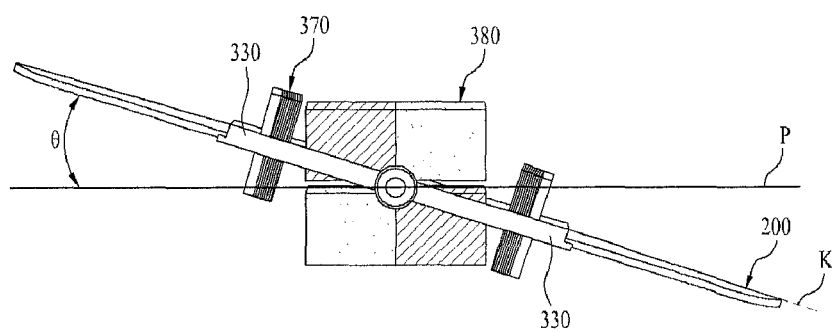
FIG. 13 illustrates a perspective view for describing a method for controlling a rotation angle and speed of a blade with a current applied to the coil, schematically.

FIGS. 11A to 11C illustrate perspective views for describing a detailed operation of flapping of a blade in accordance with a preferred embodiment of the present invention, FIG. 12 illustrates a waveform of a current applied to a coil in accordance with a preferred embodiment of the present invention, and FIG. 13 illustrates a perspective view for describing a method for controlling a rotation angle and speed of a blade with a current applied to the coil, schematically.

As described before, a direction of a force which rotates the coil 370 by means of the magnet 380 and the coil 370 varies with a direction of a current to the coil 370 and a direction of a magnetic field from the magnet 380. Since the magnet 380 is stationary, the magnetic field is fixed. Therefore, in order to make the blade 200 to flap as shown in FIGS. 11A~11C, it is required to change the direction of the current to the coil 370 with time.

Therefore, it is preferable that the current to the coil 370 is an alternating current when the blade driving unit is in operation. In more detail, as shown in FIG. 12, it is preferable that the current has a sinusoidal wave form.

In the sinusoidal current wave form in FIG. 12, a direction of a force acting on the coil 370 when the current is a positive + direction wave is different from a direction of a force acting on the coil 370 when the current is a negative − direction wave.

When the current is the positive + direction wave, the force acts on the coil 370 such that the blade 200 has a position shown in FIG. 11A, and when the current is the negative − direction wave, the force acts on the coil 370 such that the blade 200 has a position shown in FIG. 11C.

And, when the current is at a crossing point of the positive + direction wave and the negative − direction wave, since no force acts on the coil 370, the blade 200 tends to move to a position shown in FIG. 11B.

Referring to FIG. 12, if the current has the sinusoidal wave form, oscillating between a maximum value and a minimum value of a predetermined range, the bobbin 330 rotates up/down on the shaft within a predetermined range of angle, alternately. Thus, as the blade 200 flaps up and down repeatedly by the sinusoidal wave form current, the blade 200 produces forced convection.

Referring to FIG. 13, a rotating angle θ of the bobbin 200 is defined as an angle from the neutral position of the bobbin 330 (a position line marked with 'P') to a maximum rotated state (a position line marked with 'K') of the bobbin 330.

Magnitude of the force acting on the coil 370 owing to the magnet 380 and the coil 370 having the current flowing thereto is proportional to intensity of the current to the coil 370. That is, since the stronger the intensity of the current to the coil 370, as the force tending to rotate the coil 370 becomes the stronger, the rotating angle θ of the blade 200 can also become the greater.

And, since the shorter a cycle of the sinusoidal wave form current to the coil 370, the sharper a direction change of the force acting on the coil 370, a rotating speed of the blade 200 becomes the faster.

Therefore, it is preferable that the intensity and cycle of the current to the coil 370 are controllable.

That is, referring to FIG. 12, by controlling the intensity C of the sinusoidal wave form current, the angle θ of the blade 200 can be controlled, and by controlling the cycle T of the sinusoidal wave form current, the rotating speed of the blade 200 can be controlled.

In this instance, it is preferable that the angle θ of the blade 200 meets a condition of $0° \leq θ < 90°$.

Though a blade driving unit has been described, which has single bobbin 200 to move two blades 200a and 200b dependant on each other, a configuration of the blade driving unit is not limited to above.

Figure 14:
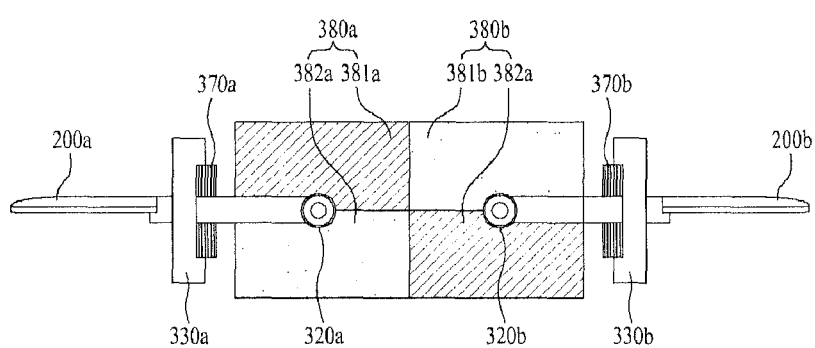
FIG. 14 illustrates a conceptual view of a blade driving unit in accordance with another preferred embodiment of the present invention, schematically.

FIG. 14 illustrates a conceptual view of a blade driving unit in accordance with another preferred embodiment of the present invention, schematically.

Referring to FIG. 14, the blade can include first and second blades 200a and 200b, the bobbin can include a first bobbin 330a connected to the first blade 200a and a second bobbin 330b connected to the second blade 200b, and the magnet can include a first magnet 380a arranged opposite to the first bobbin 330a and a second magnet 380b arranged opposite to the second bobbin 330b.

The shaft can include a first shaft 320a connected to the first bobbin 330a and passes through a first hole formed to pass through the first magnet 380a, and a second shaft 320b connected to the second bobbin 330b and passes through a second hole formed to pass through the second magnet 380b.

Such a configuration of the blade driving unit enables independent control of the currents to the first coil 370a and the second coil 370b, enabling to drive the first blade 200a and the second blade 200b, independently.

FIGS. 15A to 15D illustrate conceptual views of variations of magnet(s) and hole(s) in the magnet(s) in accordance with a preferred embodiment of the present invention, schematically.

As described before, the magnet has the upper side and the lower side having polarities different from each other, and is required to have the hole(s) formed therein.

In this instance, it is preferable that the pass through hole passes through a boundary surface at which the regions of the magnet having different polarities are in contact.

For an example, the hole is formed at the boundary surface of the upper side which is the S pole and the lower side which is the N pole.

Figure 15A:
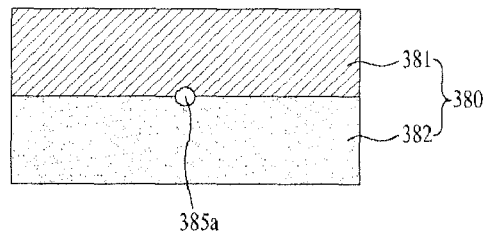
FIGS. 15A to 15D illustrate conceptual views of variations of magnet(s) and hole(s) in the magnet(s) in accordance with a preferred embodiment of the present invention, schematically.
Figure 15B:
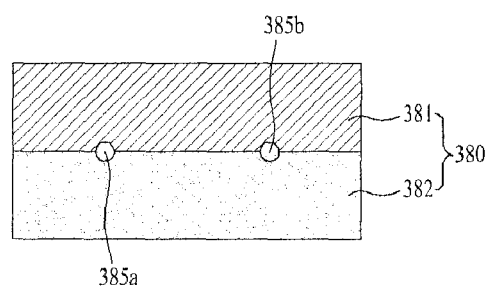
Figure 15C:
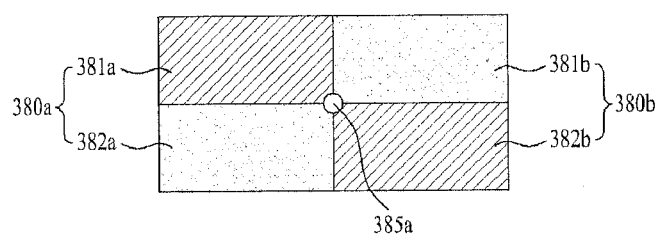
Figure 15D:
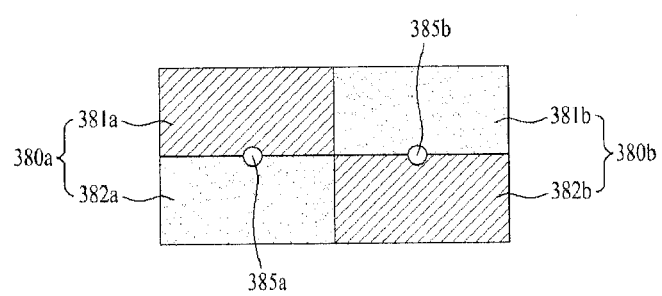

FIGS. 15A and 15B illustrate single structured magnets 380 having polarities of the upper side 381 and the lower side 382 different from each other respectively, and FIGS. 15C and 15D illustrate double structured magnet in which an upper side 381a polarity of the first magnet 380a is different from an upper side 381b polarity of the second magnet 380b, and a lower side 382a polarity of the first magnet 380a is different from a lower side 382b polarity of the second magnet 380b, respectively.

In this instance, each of the magnets in FIGS. 15A and 15B has one hole with a reference symbol '385a' for placing the shaft therein, and each of the magnets in FIGS. 15C and 15D has two holes with reference symbols '385a' and '385b'. Thus, the present invention can provide at least one hole which passes through the magnet.

Though the blade driving unit has been described, which has a structure in which the magnet is fixedly secured to the housing and the coil is connected to the blade, the present invention is not limited to this. For an example, a structure can be applied, in which the coil is fixedly secured to the housing and the magnet is connected to the blade, which will be described with reference to FIGS. 16A, 16B and 17.

Figure 16A:
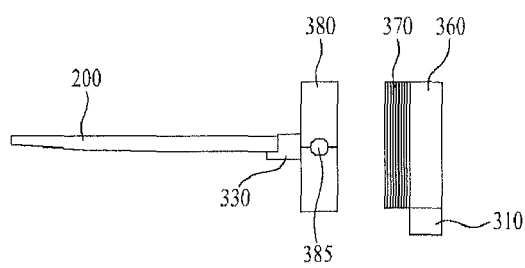
FIGS. 16A and 16B illustrate conceptual views of a blade driving unit in accordance with another preferred embodiment of the present invention, schematically.
Figure 16B:
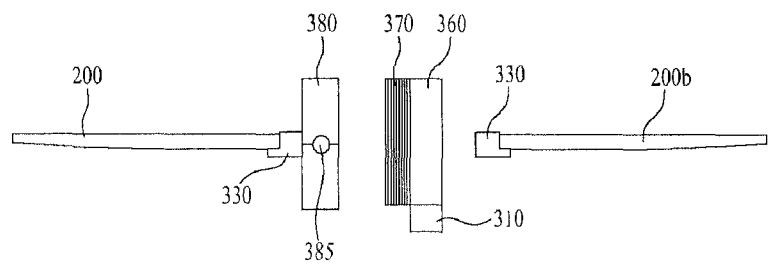

FIGS. 16A and 16B illustrate conceptual views of a blade driving unit in accordance with another preferred embodiment of the present invention, schematically.

A heat dissipating device of the embodiment has a structure in which a coil is fixedly secured and a blade moves to cause flapping of the blade for dissipating heat.

That is, the blade flaps as the magnet is mounted to a bobbin connected to the blade, and movement takes place by an electromagnetic force from a coil wound on a guide portion fixed to the housing.

FIG. 16A illustrates a heat dissipating device having one blade and single coil and single magnet arranged opposite to each other, wherein the guide portion 360 is formed at the housing 310 and the coil 370 is wound on the guide portion 360.

The magnet is positioned opposite to, and spaced from, the coil 370, the magnet 380 has a hole 385 for passing through of the shaft, the magnet 380 is mounted to the bobbin 330, and the bobbin 330 is connected to single blade 300.

And, FIG. 16B illustrates a heat dissipating device having two blades and single coil and single magnet arranged opposite to each other, wherein the two blades 200a and 200b are connected to the bobbin 330 in FIG. 16A.

Figure 17:
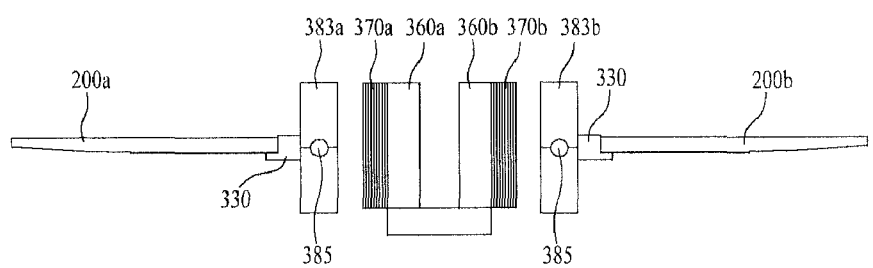
FIG. 17 illustrates a conceptual view of a blade driving unit in accordance with another preferred embodiment of the present invention, schematically.

FIG. 17 illustrates a conceptual view of a blade driving unit in accordance with another preferred embodiment of the present invention, schematically.

A heat dissipating device of the embodiment has two blades and one pair of coils and magnets arranged opposite to each other, wherein first and second guide portions 360a and 360b are formed at a housing 310, and the coils 370a and 370b are wound on the first and second guide portions 360a and 360b, respectively.

And, the first magnet 383a and the second magnet 383b are positioned at regions opposite to, and spaced from, the coils 370a and 370b wound on the first and second guide portions 360a and 360b respectively, the first and second magnets 383a and 383b have holes 385 for passing through the shafts respectively, the first magnet 383a is mounted to the first bobbin 330a and the second magnet 383b is mounted to the second bobbin 330b.

The first bobbin 330a and the second bobbin 330b may or may not be connected to each other.

The first bobbin 330a has the first blade 200a connected thereto, and the second bobbin 330b has the second blade 200b connected thereto.

Since the first and second magnets 383a and 383b have the holes 385 formed therein respectively, the holes 385 have the first and second shafts placed therein respectively, the first bobbin 330a connects the first shaft to the first blade 200a and the second bobbin 330b connects the second shaft to the second blade 200b.

Since operation of the heat dissipating device shown in FIGS. 16A, 16B and 17 are similar to the foregoing embodiment, description of the operation will be omitted.

Figure 18:
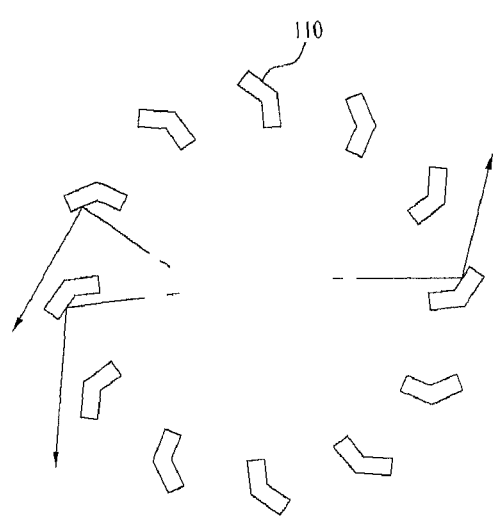
FIG. 18 illustrates a section of a preferred structure of heat dissipating fins of the present invention.

FIG. 18 illustrates a section of heat dissipating fins in accordance with another preferred embodiment of the present invention, schematically.

Referring to FIG. 18, the each of the heat dissipating fins 110 can have a bent region.

That is, it is preferable that each of the heat dissipating fins 110, arranged at the edge of the other surface of the heat dissipating member at fixed intervals, has the bent region for effective reception of an air flow formed by the flapping of the blade positioned on the inner side of the heat dissipating fins 110, thereby increasing heat dissipating efficiency.

This configuration enables improvement of the heat dissipating efficiency of the heat dissipating fins 110 as the air flow is brought into contact to the bent region.

The bent regions of the heat dissipating fins 110 can make a sectional form of the heat dissipating fins 110 to be a whirling pattern.

At the end, the bent regions at the heat dissipating fins 110 increase contact areas with the air flow, enabling smooth cooling of the heat dissipating fins 110.

Figure 19:
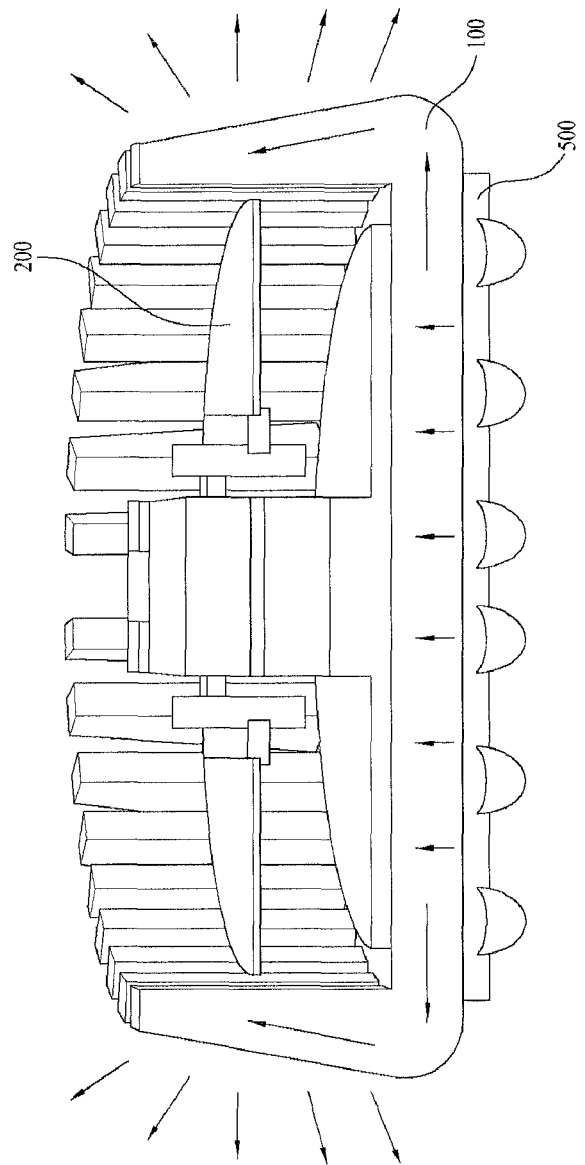
FIG. 19 illustrates a section of a heat generating unit provided to a heat dissipating device in accordance with a preferred embodiment of the present invention.

FIG. 19 illustrates a section of a heat generating unit provided to a heat dissipating device in accordance with a preferred embodiment of the present invention.

As described before, the heat generating unit, which is defined as an electronic device which generates heat as it is driven, is in contact with one side of the heat dissipating member 100 of the heat dissipating device such that the air flow caused by the flapping of the blade 200 dissipates the heat transmitted to the heat dissipating fins 110 from the heat generating unit via the one side of the heat dissipating member 100, effectively.

The heat generating unit can be any one selected from an LED (Light Emitting Diode) lighting apparatus, a CPU (Central Processing Unit), a backlight unit, a display device, a hard disk drive, a portable terminal, a notebook computer, a computer module, and a projector. That is, the heat dissipating device of the present invention has wide applications.

FIG. 19 illustrates an example in which an LED lighting apparatus 500 is applied as the heat generating unit.

As has been described, the heat dissipating device of the present invention has the following advantages.

The forced air flow from an inner side of the heat dissipating fins permits effective dissipation of heat transmitted to the heat dissipating fins. And, the bringing of the air flow with a high flow pressure caused by flapping of the blade into contact with the heat dissipating fins enhances heat dissipating efficiency of the heat at the heat dissipating fins and in the vicinity thereof.

And, the flapping of the blade within a fixed range of angle permits to make the heat dissipating device and the driving unit small.

Moreover, the heat dissipating device can cool down the heat dissipating member in a low noise state since the heat dissipating device produces no noise caused by continuous fan rotation.

Along with this, the bent regions of the heat dissipating fins, increasing contact areas to the air flow, permits smooth cooling down of the heat dissipating fins.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A heat dissipating device comprising:
   a heat dissipater thermally coupled to a heat generator, the heat dissipater configured to transmit heat from the heat generator to air;
   at least one blade that forms an air flow to at least a portion of the heat dissipater by flapping; and
   a blade drive that drives the at least one blade to flap when operating,
   wherein the blade drive includes;
   at least one shaft,
   at least one magnet having an upper side and a lower side with polarities different from each other,
   at least one bobbin connected to the at least one blade, the at least one bobbin configured to rotate up and down alternately within a predetermined range of angles on an axis of the at least one shaft, and
   a coil wound on the at least one bobbin spaced from the at least one magnet that enables a current to pass,
   wherein the at least one bobbin drives the at least one blade as the at least one bobbin is rotated by a force generated by the at least one magnet and the coil when the current flows to the coil.

2. The device as claimed in claim 1, wherein the blade drive drives the at least one blade to flap in up/down directions within a predetermined range of angles during operation.

3. The device as claimed in claim 1, wherein the at least one bobbin includes a guide portion having the coil wound thereon,
   wherein, when the at least one bobbin is at a neutral position, a portion of the coil wound on the guide portion is positioned at a height corresponding to the upper side of the at least one magnet and an other portion of the coil wound on the guide portion is positioned at a height corresponding to the lower side of the at least one magnet.

4. The device as claimed in claim 3, wherein the current flowing to the coil is an alternating current when the blade drive is in operation.

5. The device as claimed in claim 4, wherein intensity and a cycle of the current flowing to the coil are controllable.

6. The device as claimed in claim 1, wherein the at least one blade includes a first blade connected to one end of the at least one bobbin and a second blade connected to the other end of the at least one bobbin,
   the at least one magnet is arranged to pass through a receiving portion in the at least one bobbin, and
   the at least one shaft passes through a hole formed to pass through the at least one magnet.

7. The device as claimed in claim 6, wherein the at least one magnet includes a first magnet and a second magnet arranged parallel to the first magnet,
   the coil includes a first coil arranged opposite to the first magnet, and a second coil arranged opposite to the second magnet, and
   the first blade is arranged opposite to the first coil and the second blade is arranged opposite to the second coil.

8. The device as claimed in claim 7, wherein a polarity of an upper side of the first magnet is different from a polarity of an upper side of the second magnet.

9. The device as claimed in claim 1, wherein the at least one blade includes a first blade and a second blade,
   the at least one bobbin includes a first bobbin connected to the first blade and a second bobbin connected to the second blade,
   the at least one magnet includes a first magnet arranged opposite to the first bobbin and a second magnet arranged opposite to the second bobbin, and
   the at least one shaft includes a first shaft connected to the first bobbin and passing through a first hole formed to pass through the first magnet and a second shaft connected to the second bobbin and passing through a second hole formed to pass through the second magnet.

10. The device as claimed in claim 1, wherein the blade drive further includes a magnetic spring provided to the at least one bobbin spaced from the at least one magnet, the magnetic spring being configured such that a restoration force is applied to the magnetic spring in a direction in which magnetic flux from the at least one magnet is the smallest.

11. The device as claimed in claim 10, wherein the magnetic spring includes an iron piece having a center line positioned at a height corresponding to a boundary surface between the upper side and the lower side of the at least one magnet which have polarities different from each other when the at least one bobbin is at a neutral position.

12. The device as claimed in claim 1, further comprising a housing that rotatably mounts opposite ends of the at least one shaft thereon and fixedly secures the at least one magnet thereto.

13. The device as claimed in claim 1, wherein the heat dissipater has one surface in contact with the heat generator and an other surface having a plurality of heat dissipating fins provided to an edge thereof spaced from one another.

14. The device as claimed in claim 13, wherein the at least one blade and the blade drive are positioned in a space formed between the other surface of the heat dissipater and the heat dissipating fins.

* * * * *